United States Patent
Fischer et al.

(10) Patent No.: US 6,252,437 B1
(45) Date of Patent: Jun. 26, 2001

(54) CIRCUIT AND METHOD FOR REDUCING A PROPAGATION DELAY ASSOCIATED WITH A COMPARATOR AND A COMPARATOR EMPLOYING THE SAME

(75) Inventors: Jonathan H. Fischer, Blandon; Weilin Zhu, Allentown, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/413,960

(22) Filed: Oct. 7, 1999

(51) Int. Cl.[7] .................... H03K 5/13; H03K 5/02

(52) U.S. Cl. ............................ 327/89; 327/563

(58) Field of Search ................... 327/51, 52, 53, 327/54, 56, 65, 266, 280, 70, 77–82, 87–89, 560–563; 330/252, 253, 269, 277

(56) References Cited

U.S. PATENT DOCUMENTS

| | | | | |
|---|---|---|---|---|
| 5,898,323 | * | 4/1999 | Suda | 327/66 |
| 5,963,062 | * | 10/1999 | Fujii | 327/74 |
| 5,990,708 | * | 11/1999 | Hu | 327/68 |
| 6,020,768 | * | 2/2000 | Lim | 327/77 |
| 6,124,738 | * | 9/2000 | Iga | 327/89 |
| 6,127,854 | * | 10/2000 | Illegems | 327/66 |

* cited by examiner

Primary Examiner—My-Trang Nu Ton

(57) ABSTRACT

A circuit and method for reducing a propagation delay associated with a comparator and a comparator employing the circuit or method. In one embodiment, the comparator, includes: (1) an input stage that receives a differential input signal and develops therefrom a threshold signal, (2) an output stage, coupled to the input stage, that develops a level shifted single-ended output signal as a function of the threshold signal, and (3) a speed-up circuit, associated with the input stage, that reduces a time period to develop the determinant signal thereby decreasing a propagation delay in developing the level shifted single-ended output signal from the differential input signal.

20 Claims, 2 Drawing Sheets

US 6,252,437 B1

CIRCUIT AND METHOD FOR REDUCING A PROPAGATION DELAY ASSOCIATED WITH A COMPARATOR AND A COMPARATOR EMPLOYING THE SAME

TECHNICAL FIELD OF THE INVENTION

The present invention is directed, in general, to electronic circuitry and, more specifically, to a circuit and method for reducing a propagation delay associated with a comparator and a comparator employing the same.

BACKGROUND OF THE INVENTION

Technology in the areas of telecommunications and computer systems is continually challenged to provide increased processing speeds with lower power requirements. Lap top computer systems provide a particular challenge in this respect in that higher processing speeds and lower power requirements form the basis for a competitive advantage for a supplier. Users of personal computer systems, especially lap top computer users, are also demanding increased functionality in addition to the enhanced speed and power requirements. One such demand is the ability to reliably connect to a telephone line to transmit and receive data at high data speeds. For example, since the wide use of the Internet, consumers are demanding that modems connect at the same high data speed each time they connect to the Internet.

Personal computer systems use very fast internal clock signals, which are approaching the realm of one gigahertz, to achieve the fast processing rates. The fast clock signals generate considerable electrical noise that is picked up by the various interconnections inside the computer system. The electrical noise typically manifests itself as a common mode signal which can occur on the signal return or "ground" lines causing the lines to "bounce." If the interfering signals become too large or their effect is not properly accounted for, the interfering signals can cause the operation of the computer system to become intermittent or unreliable. One approach to minimizing the effect of the common mode signals is the use of differential input signals.

A differential input signal consists of two signals wherein the information to be presented is supplied as the signal inverses (i.e., 180 degrees out of phase) or logical complements of each other. A common mode noise signal would add equally to each of the interconnecting lines or traces carrying a differential input signal if the two lines are in close proximity to one another. As long as a circuit can determine the differential input signal, even in the presence of a large common mode noise signal, the circuit will reliably respond to the logic command intended thereby overcoming the common mode noise interference.

A commonly used differential input circuit in computer and telecommunication systems is a comparator circuit. When used in concert with other logic elements having single-ended logic inputs, the differential input comparator accepts a differential input signal and converts the differential logical information to a single-ended logic output signal. The comparators form critical circuit elements in modern computer and telecommunications systems and are, therefore, subject to the same requirements of increased processing speed with lower power usage.

Accordingly, what is needed in the art is a differential comparator that demonstrates satisfactory throughput capability while minimizing the impact on power requirements.

SUMMARY OF THE INVENTION

To address the above-discussed deficiencies of the prior art, the present invention provides a circuit and method for reducing a propagation delay associated with a comparator and a comparator employing the circuit or method. In one embodiment, the comparator, includes: (1) an input stage that receives a differential input signal and develops therefrom a determinant signal, (2) an output stage, coupled to the input stage, that develops a level shifted single-ended output signal as a function of the determinant signal, and (3) a speed-up circuit, associated with the input stage, that reduces a time period to develop the determinant signal thereby decreasing a propagation delay in developing the level shifted single-ended output signal from the differential input signal. The determinant signal is a scaled representation of the differential input signal wherein the scaling factor is associated with the gain of the input stage.

The present invention therefore introduces, in one aspect, the broad concept of decreasing the propagation delay associated with a comparator by reducing the time period to develop a determinant signal therein. The comparator of the present invention achieves the enhanced performance while conserving the power requirements. In one embodiment of the present invention, the speed-up circuit reduces the time period to develop the determinant signal by shielding a portion of an intrinsic capacitance at a critical node associated with a path between a current source and the speed-up circuit in the comparator. The shielding of the intrinsic capacitance may occur as the output of the comparator transitions to a true condition. Of course, the aforementioned method of employing the speed-up circuit is but one example to achieve the intended purpose.

In one embodiment of the present invention, the input stage includes a current source having at least one semiconductor device. The semiconductor device may be a complementary metal oxide silicon (CMOS) transistor. Those skilled in the pertinent art will recognize, however, that the present invention can be employed with other types of semiconductor devices.

In one embodiment of the present invention, the speed-up circuit includes a pseudo-cascode pull-up current source. Those skilled in the pertinent art will recognize, however, that the speed-up circuit may be embodied in other circuits such as different pull-up current sources.

In one embodiment of the present invention, the speed-up circuit includes at least one switch. The speed-up circuit may cooperate with a current source to isolate the effect of capacitance at the output of the current source. In another embodiment of the present invention, the speed-up circuit may include more than one switch.

In one embodiment of the present invention, the output stage includes at least one inverter circuit. In another embodiment of the present invention, the output stage includes more than one inverter circuit and may include other types of circuits as the specific application dictates.

In one embodiment of the present invention, the output stage includes a feedback circuit. In yet another related, but alternative embodiment, the feedback circuit reduces a power dissipation in the output stage in developing the level shifted single-ended output signal. In still another related, but alternative embodiment, the feedback circuit reduces the power dissipation by decreasing a current flow through the output stage.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
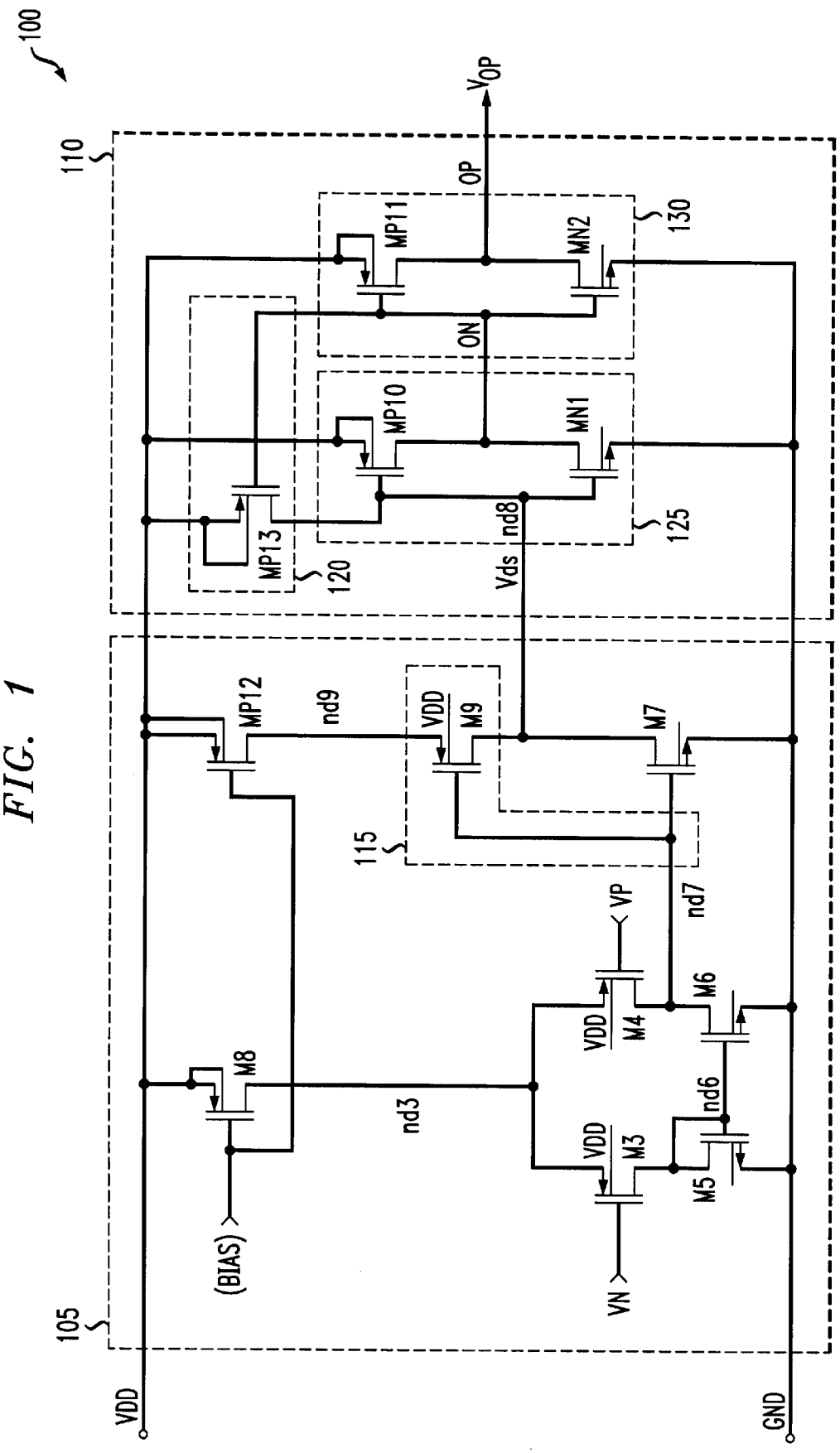
FIG. 1 illustrates a schematic diagram of a comparator constructed according to the principles of the present invention.

Referring initially to FIG. 1, illustrated is a schematic diagram of a comparator 100 constructed according to the principles of the present invention. The comparator 100, using a supply voltage VDD and a ground GND for power, includes an input stage 105 that receives first and second input signals VN, VP, an output stage 110 that provides a level shifted single-ended output signal Vop at an output node OP. The input stage 105 includes a differential input circuit having first, second, third, fourth and fifth transistors M3, M4, M5, M6, M8 and a coupling circuit having sixth, seventh and eighth transistors M7, M9, MP12. The seventh transistor M9 forms a portion of a speed-up circuit 115 that works in concert with the eighth transistor MP12 to form a pseudo-cascode pull-up current source. The output stage 110 includes a first inverter circuit 125 having ninth and tenth transistors MP10, MN1, a second inverter circuit 130 having eleventh and twelfth transistors MP11, MN2 and a feedback circuit 120 having a thirteenth transistor MP13.

In the illustrated embodiment, the input stage 105 receives a differential input signal via the first and second input signals VN, VP and develops therefrom a determinant signal Vds at a node nd8 formed at the junction of the sixth and seventh transistors M7, M9. The output stage 110, coupled to the input stage 105, develops the level shifted single-ended output signal Vop as a function of the determinant signal Vds. The speed-up circuit 115, associated with the input stage 105, reduces a time period to develop the determinant signal Vds thereby decreasing a propagation delay in developing the level shifted single-ended output signal Vop from the differential first and second input signals VN, VP.

An objective associated with the present invention includes decreasing the propagation delay associated with the comparator 100 while, at the same time, conserving its power requirements. The determinant signal Vds is formed in a path between the input stage 105 and the output stage 110. In the illustrated embodiment, the speed-up circuit 115 reduces the propagation delay time of the comparator 100 by shielding a portion of an intrinsic capacitance associated with the node nd8 that would otherwise affect the response time of the determinant signal Vds. Enhancing the transition speed of the determinant signal Vds reduces the propagation delay time as, for instance, the output of the comparator 100 transitions to a TRUE condition.

In the illustrated embodiment, the eighth transistor MP12 is a current source formed by a semiconductor device (e.g., CMOS transistor). A bias voltage is applied to the gate of the eighth transistor MP12 that determines the value of the current it supplies. The speed-up circuit 115 is formed by interposing the seventh transistor M9 between the eighth transistor MP12 and the node nd8 thereby forming a pseudo-cascode pull-up current source.

The operation of the speed-up circuit 115 may be illustrated by two examples. In the first example, the second input signal VP starts more negative than the first input signal VN and becomes more positive (low-to-high output transition case). The second example occurs when the second input signal VP starts more positive than the first input signal VN and becomes more negative (high-to-low output transition case).

With the second input signal VP more negative than the first input signal VN, the node nd8 is pulled up and the sixth transistor M7 is turned on hard enough to pull the node nd7 close to the ground GND. The eighth transistor MP12, functioning as a current source, forces a node nd9 to be the sum of the gate to source voltages of the sixth transistor M7 and the seventh transistor M9. The node nd8 is below the switching point of the first inverter circuit 125 causing an output node ON of the first inverter circuit 125 to be high and the output node OP of the second inverter circuit 130 to be low. The thirteenth transistor MP13, a P-type CMOS transistor, is off.

When the second input signal VP becomes more positive than the first input signal VN, the fourth transistor M6 will pull a node nd7 towards the ground GND turning the sixth transistor M7 off. The gate of the seventh transistor M9 is also pulled towards the ground GND causing it to turn on harder as it tries to pull the node nd8 up to the node nd9. The seventh transistor M9 plays two roles at this point. First, it acts as the pseudo-cascode device shielding the node nd8 from the capacitance on the node nd9. This action allows the current from the eighth transistor MP12 to charge the node nd8 more quickly. Secondly, the seventh transistor M9 also uses the parasitic capacitance on the node nd9 to supplement the current from the eighth transistor MP12 as it pulls the node nd8 toward the node nd9. The switching point of the first inverter circuit 125 is designed to be a voltage level to which the seventh transistor M9 can quickly pull the node nd8.

In the output stage 110, the output signal Von, on the output node ON of the first inverter circuit 125, which employs the ninth and tenth transistors MP10, MN1, moves toward the ground GND as the tenth transistor MN1 turns on from a rising voltage on the node nd8. This action causes the level shifted single-ended output signal Vop, of the second inverter circuit 130 which employs the eleventh and twelfth transistors MP11, MN2, to rise toward the supply voltage VDD thereby indicating a TRUE output condition for the comparator 100. An output signal Von on the output node ON moving towards ground GND also causes the thirteenth transistor MP13 employed in the feedback circuit 120 to turn on thereby reinforcing the rising voltage on the node nd8 to complete the transition. The feedback circuit 120 reduces power dissipation in the output stage 110 in that it only increases the pull-up current to the node nd8 to quickly charge the node up to the supply voltage VDD. This shortens the time that the ninth and tenth transistors MP10 and MN1 simultaneously conduct current, and thus minimizes power dissipation.

For the second example, the second input signal VP starts more positive than the first input signal VN and becomes more negative. As the second input signal VP becomes more negative than the first input signal VN, the fourth transistor M6 in the input stage 105 turns off and the second transistor M4 pulls the node nd7 towards the node nd3. This reduces the current flow through the seventh transistor M9 and turns on the sixth transistor M7 hard enough to pull the node nd8 below the switching threshold voltage associated with the determinant signal Vds of the first inverter circuit 125. The seventh transistor M9 acts as a cascode device by shielding the node nd8 from the capacitance on the node nd9 and speeds the transition of the node nd8 towards the ground GND. Once the sixth transistor M7 pulls the node nd8 below the switching threshold voltage of the first inverter circuit 125, the output signal Von on the output node ON rises toward the supply voltage VDD, and the current through the thirteenth transistor MP13 is reduced. This action further reduces the time required for the node nd8 to approach the ground GND. The added capacitance of the seventh transistor M9 may slightly increase the high-to-low transition time at the node nd8, and therefore the overall comparator high-to-low propagation time from the input signals VN, VP of the comparator 100 to the output signal Vop on the output node OP. Even in view of the aforementioned characteristic of the speed-up circuit 115, the overall propagation delay of the comparator 100 is significantly decreased as illustrated with respect to FIG. 2.

Figure 2:
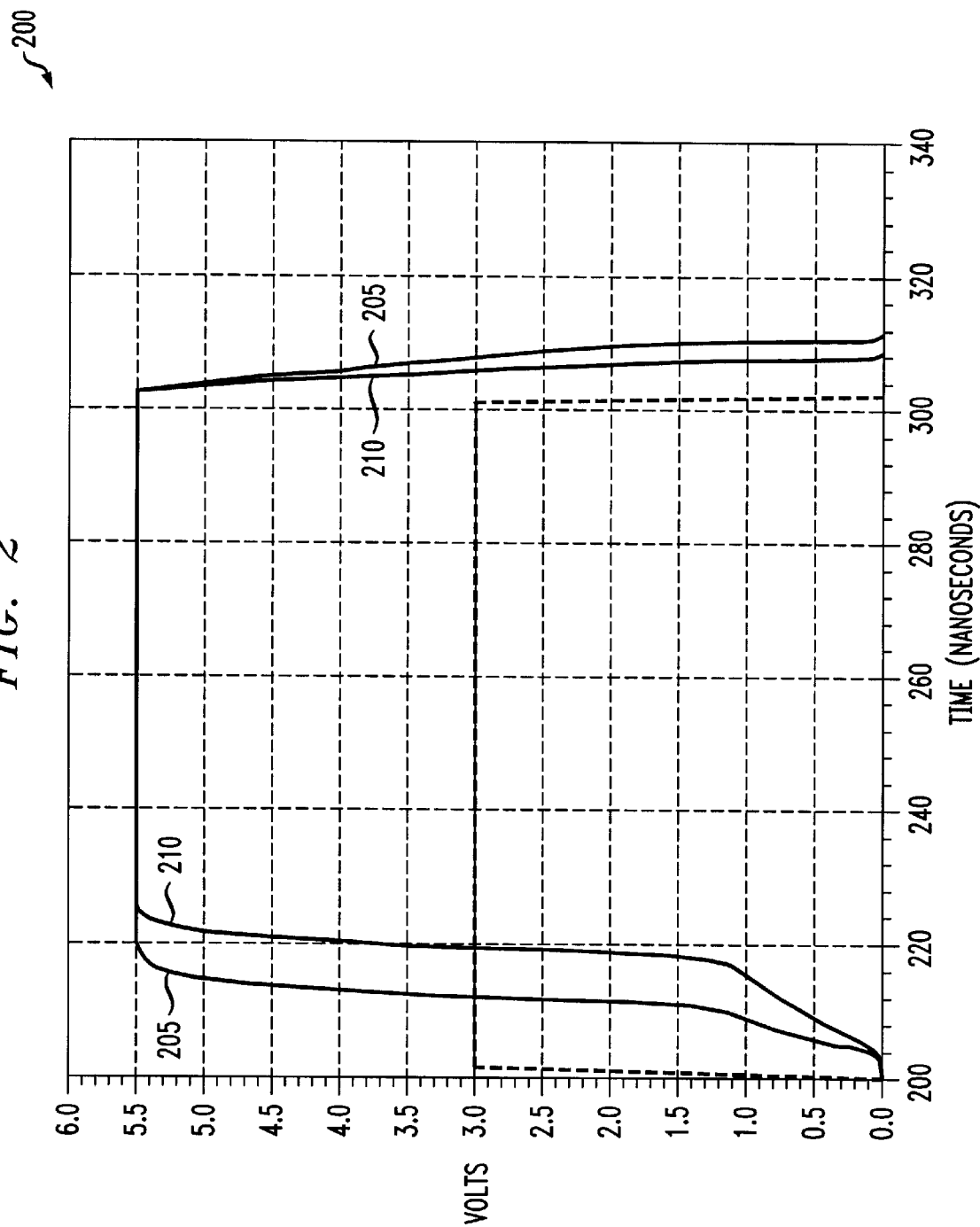
FIG. 2 illustrates a waveform showing an improved propagation delay afforded by the comparator of FIG. 1.

Turning now to FIG. 2, illustrated is a waveform 200 showing an improved propagation delay afforded by the comparator 100 of FIG. 1. The waveform 200 illustrates the level shifted single-ended output signal Vop (trace 205) in comparison to a level shifted single-ended output signal (trace 210) for a comparator not employing the speed-up circuit 115 of the present invention. With continuing reference to FIG. 1 and just before the start of the waveform 200 at 200 nanoseconds shown on the horizontal time axis, a voltage on a node nd7 causes the sixth transistor M7 to be turned on pulling the determinant signal Vds to the ground GND. At approximately 205 nanoseconds, the voltage on the node nd7 moves to ground GND causing the sixth transistor M7 to turn off and the determinant signal Vds to rise.

Pulling the node nd7 to the ground GND also causes the speed-up circuit 115 employing the seventh transistor M9 to begin pulling the determinant signal Vds upward toward the supply voltage VDD for the comparator 100. This results in a smaller propagation delay time as illustrated by the trace 205. Once the determinant signal Vds is large enough to turn on the first inverter circuit 125, the feedback circuit 120 employing the thirteenth transistor MP13 quickly pulls the determinant signal Vds toward the supply voltage VDD. This action rapidly moves the trace 205 upward as shown. The speed-up circuit 115 is seen to reduce the more critical turn-on propagation delay by about eight to ten nanoseconds (see trace 205 verses trace 210). While the speed-up circuit 115 may cause the less critical turn-off propagation delay time to increase by only about two to four nanoseconds, the overall propagation delay for the comparator 100 is significantly decreased.

Those skilled in the art should understand that the previously described embodiments of the speed-up circuit and comparator are submitted for illustrative purposes only and other embodiments capable of reducing a propagation delay associated with the comparator are well within the broad scope of the present invention. Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. Also, the aforementioned method and time periods demonstrating the advantages associated with the embodiment of the comparator of FIG. 1 were submitted for illustrative purposes only.

Although the present invention has been described in detail, those skilled in the art should understand that they can make various changes, substitutions and alterations herein without departing from the spirit and scope of the invention in its broadest form.

What is claimed is:

1. A comparator, comprising:
    an input stage that receives a differential input signal and develops therefrom a determinant signal;
    an output stage, coupled to said input stage, that develops a level shifted single-ended output signal as a function of said threshold signal; and
    a speed-up circuit, associated with said input stage, that reduces a time period to develop said determinant signal thereby decreasing a propagation delay in developing said level shifted single-ended output signal from said differential input signal.

2. The comparator as recited in claim 1 wherein said input stage comprises a current source coupled to said speed-up circuit.

3. The comparator as recited in claim 2 wherein said speed-up circuit reduces said time period by shielding a portion of an intrinsic capacitance associated with a path between said current source and said speed-up circuit.

4. The comparator as recited in claim 2 wherein said current source comprises at least one semiconductor device.

5. The comparator as recited in claim 1 wherein said speed-up circuit comprises a pseudo-cascode pull-up current source.

6. The comparator as recited in claim 1 wherein said speed-up circuit comprises at least one switch.

7. The comparator as recited in claim 1 wherein said output stage comprises at least one inverter circuit.

8. The comparator as recited in claim 1 further comprising a feedback circuit associated with said output stage.

9. The comparator as recited in claim 8 wherein said feedback circuit reduces a power dissipation in said output stage in developing said level shifted single-ended output signal.

10. The comparator as recited in claim 9 wherein said feedback circuit reduces said power dissipation by decreasing a current flow through said output stage.

11. For use with a comparator having an input stage and an output stage that converts a differential input signal to a level shifted single-ended output signal, a method of reducing a propagation delay, comprising:
    developing a determinant signal from said differential input signal in said input stage;
    developing said level shifted single-ended output signal as a function of said determinant signal in said output stage; and
    reducing a time period to develop said determinant signal with a speed-up circuit thereby reducing said propagation delay in developing said level shifted single-ended output signal from said differential input signal.

12. The method as recited in claim 11 wherein said input stage comprises a current source coupled to said speed-up circuit.

13. The method as recited in claim 12 wherein said reducing comprises shielding a portion of an intrinsic capacitance associated with a path between said current source and said speed-up circuit.

14. The method as recited in claim 12 wherein said current source comprises at least one semiconductor device.

15. The method as recited in claim 11 wherein said speed-up circuit comprises a pseudo-cascode pull-up current source.

16. The method as recited in claim 11 wherein said speed-up circuit comprises at least one switch.

17. The method as recited in claim 11 wherein said output stage comprises at least one inverter circuit.

18. The method as recited in claim 11 further comprising a feedback circuit associated with said output stage.

19. The method as recited in claim 18 wherein said feedback circuit reduces a power dissipation in said output stage in developing said level shifted single-ended output signal.

20. The method as recited in claim 19 wherein said feedback circuit reduces said power dissipation by decreasing a current flow through said output stage.

* * * * *

UNITED STATES PATENT AND TRADEMARK OFFICE
CERTIFICATE OF CORRECTION

| | | |
|---|---|---|
| PATENT NO. | : 6,252,437 B1 | Page 1 of 1 |
| DATED | : June 26, 2001 | |
| INVENTOR(S) | : Jonathan H. Fischer et al. | |

It is certified that error appears in the above-identified patent and that said Letters Patent is hereby corrected as shown below:

<u>Column 6, claim 1,</u>
Line 17, please change "threshold" to -- determinant --.

Signed and Sealed this

Twenty-seventh Day of November, 2001

*Attest:*

*Attesting Officer*

NICHOLAS P. GODICI
*Acting Director of the United States Patent and Trademark Office*